US008624636B2

(12) United States Patent
Godes

(10) Patent No.: US 8,624,636 B2
(45) Date of Patent: Jan. 7, 2014

(54) DRIVE CIRCUIT AND METHOD FOR SEMICONDUCTOR DEVICES

(75) Inventor: Robert E. Godes, Berkeley, CA (US)

(73) Assignee: Brillouin Energy Corp., Berkeley, CA (US)

( * ) Notice: Subject to any disclaimer, the term of this patent is extended or adjusted under 35 U.S.C. 154(b) by 0 days.

(21) Appl. No.: 11/751,615

(22) Filed: May 21, 2007

(65) Prior Publication Data

US 2008/0018376 A1    Jan. 24, 2008

Related U.S. Application Data

(63) Continuation-in-part of application No. 11/419,671, filed on May 22, 2006, now abandoned.

(51) Int. Cl.
*H03K 19/084* (2006.01)
(52) U.S. Cl.
USPC .......................................... 327/108; 327/112
(58) Field of Classification Search
USPC ...................... 327/108, 112, 333; 326/26, 27
See application file for complete search history.

(56) References Cited

U.S. PATENT DOCUMENTS

| 4,503,518 | A | | 3/1985 | Iwahashi |
| 5,097,303 | A | | 3/1992 | Taguchi |
| 6,144,217 | A | * | 11/2000 | Iwata et al. ..................... 326/27 |
| 2006/0290388 | A1 | * | 12/2006 | Tolle et al. .................... 327/108 |
| 2007/0268045 | A1 | | 11/2007 | Godes |

FOREIGN PATENT DOCUMENTS

WO    WO 2007/137268 A2    11/2007

OTHER PUBLICATIONS

Office Action mailed Jun. 5, 2008 in U.S. Appl. No. 11/419,671.
Office Action mailed Sep. 12, 2007 in U.S. Appl. No. 11/419,671.
Blake, C., et al., "IGBT or MOSFET: Choose Wisely", (Actual publication date unknown, but at least as early as Mar. 3, 2006), International Rectifier, pp. 1-5.
Krausse, G. J., "De-Series Fast Power Mosfet™ An Introduction", 2000, Directed Energy, Inc., pp. 1-17.
Motto, E.R., "Hybrid Circuits Simplify IGBT Module Gate Drive", Powerex Inc., Youngswood, Pennsylvania, 1999, pp. 1-10.
Oh, K. S., "Application Note 9016, IGBT Basics 1", Rev. A2, Fairchild Semiconductor Corporation, Feb. 2001, pp. 1-29.
Um, K. J., "Application Note 9020, IGBT Basic II", Rev. A, Fairchild Semiconductor Corporation, Apr. 2002, pp. 1-25.
AN-937, "Gate Drive Characteristics and Requirements for HEXFET™ s", Aug. 3, 2004, International Rectifier, pp. 1-21.
Data Sheet for IR2117(S)/IR2118(S) & (PbF), No. PD60146, Rev. N, International Rectifier, (Actual publication date unknown, but at least as early as Feb. 1, 2004), 1-18 pages.
Data Sheet for IRF840, Rev. B, 8A 500V, 0.850 Ohm, N-Channel Power MOSFET, Fairchild Semiconductor Corporation, Jan. 2002, pp. 1-7.
Data Sheet for IRF840, HEXFET Power MOSFET, PD-9.376H, International Rectifier, (Actual publication date unknown, but at least as early as Apr. 24, 2006), pp. 269-274.
International Search Report and Written Opinion of Feb. 12, 2008 for Application No. PCT/2007/069484, 7 pages.
Sedra/Smith, Microelectronic, 5$^{th}$ Ed., 2004, Oxford University Press, p. 259.

* cited by examiner

*Primary Examiner* — Lincoln Donovan
*Assistant Examiner* — Diana J Cheng
(74) *Attorney, Agent, or Firm* — Kilpatrick Townsend & Stockton LLP

(57) ABSTRACT

Techniques for overcoming many of the speed limitations of switching a gated device while protecting the device from damage provide a dynamic driving voltage to the gate of the device being switched. This dynamic voltage provides a way to overcome the complex impedances between the drive point and the actual gate allowing faster switching speeds. This dynamic driving voltage is provided by starting with a fixed amount of charge at a higher initial potential. The fixed charge and voltage are chosen so as not to exceed the device's specified maximum gate current or the device's maximum voltage between the gate and the source (punch-through voltage).

10 Claims, 10 Drawing Sheets

DRIVE CIRCUIT AND METHOD FOR SEMICONDUCTOR DEVICES

CROSS-REFERENCE TO RELATED APPLICATION

The present application is a continuation-in-part (CIP) of U.S. patent application Ser. No. 11/419,671, filed May 22, 2006 for "Drive Circuit and Method for Semiconductor Devices" (inventor Robert E. Godes), the entire disclosure of which is incorporated by reference.

BACKGROUND OF THE INVENTION

The present invention relates generally to power semiconductor devices, and more specifically to techniques for driving the gate of large power devices such as power MOSFETs and insulated gate bipolar transistors (IGBTs).

The operation of a power MOS device entails rapid charging and discharging of the gate to cause transitions through the device's linear region between its fully enhanced ("on") and fully shut off ("off") states. Typical gate drive circuit technology applies a DC voltage to the device gate to charge and discharge the gate and thus change the device state. This gate voltage is chosen to be above the full enhancement voltage but below the maximum gate voltage. Reference to the gate voltage or voltage on the gate is normally the voltage relative the source (if the device is an FET), or relative to the emitter (if the device is an IGBT).

The power dissipation of the device is reasonably given by the product of drain-source current and drain-source voltage. When the device is in its off state, the drain-source voltage is significant, but there is substantially no drain-source current, and the dissipation is extremely low. Similarly, when the device is in its on state, the drain-source current is significant, but the drain-source voltage is substantially zero, and the dissipation is extremely low. However, when the device is passing through its linear state, the drain-source current is increasing/decreasing and drain-source voltage is decreasing/increasing (depending on the direction of the transition). During this time, power is being dissipated.

Thus, it is a well-known goal to improve the switching speed, but like many well-known goals, it is easier the than done. The ability to rapidly charge and discharge the gate is impeded by a number of factors, including one or more of the following: (a) inductance and resistance introduced by the package and system interconnect; (b) the Miller effect (the tendency of a capacitance to be multiplied by the gain of adjacent stages in a electrical circuit); and (c) source and drain inductance.

For a given voltage applied to the gate drive point of the device to be switched, the speed at which the gate voltage can change is limited by the complex impedance, including offsets, of the circuit, even if the gate driver has zero impedance. However, using a larger steady-state drive voltage to overcome the complex impedance of the switching system and increase the switching speed would destroy the device being switched as soon as the charge on the gate exceeded the maximum allowable charge for the device.

SUMMARY OF THE INVENTION

In short, the present invention is able to overcome many of the speed limitations of switching a gated device while protecting the device from damage.

In one aspect of the invention, this is accomplished by providing a dynamic driving voltage to the gate of the device being switched. This dynamic voltage provides a way to overcome the complex impedances between the drive point and the actual gate allowing faster switching speeds, preferably while still allowing a resistance in series with the gate to dampen out ringing (this damping resistance is provided by a bilateral switch used to hold the device in the desired state.). Embodiments of the invention provide this dynamic driving voltage by starting with a fixed amount of charge at a higher initial potential. The fixed charge and voltage are chosen so as not to exceed the device's specified maximum gate current or the device's maximum voltage between the gate and the source (punch-through voltage).

Embodiments of the invention provide techniques for switching a semiconductor device between first and second device states by controlling the charge on a gate associated with the device. The first and second device states are characterized by first and second voltages on the gate, with the first voltage being higher than the second voltage. For an n-channel device, the first and second device states would be ON and OFF states, respectively, while for a p-channel device, the first and second device states would be OFF and ON states, respectively.

Embodiments of the invention use a capacitor that is charged by a voltage supply to a voltage (third voltage) that is significantly higher than the voltage (e.g., the first voltage) to which the device gate is subjected. The capacitor and the voltage source together define a charge amount that, when transferred to the gate, results in a voltage on the gate that is commensurate with the first voltage so as to cause the semiconductor device to enter the first device state. The charge is supplied to a circuit node coupled to the gate with a time behavior characterized by a sufficiently high initial voltage to overcome a complex impedance that exists between the circuit node and the gate.

In specific examples, a device transition occurs with a positive voltage on the gate, and the third voltage is a relatively large positive voltage. However, for ease of nomenclature, a statement that a voltage is higher than another should be understood to cover a case of a negative voltage whose absolute voltage value is greater than that of the other voltage.

Another aspect of the invention provides a circuit comprising a voltage source supplying a third voltage that is significantly higher than the first voltage, a charge storage device, switching circuitry for selectively connecting the charge storage device to the voltage source, and control circuitry, coupled to the switching circuitry and responsive to an input signal.

When the input signal signifies a transition to the first device state, the switching circuitry connects the voltage source to the charge storage device, and the charge storage device transfers an amount of charge characteristic of the charge storage device and the voltage source to the gate. The charge storage device and the third voltage are chosen so that the voltage on the gate, after the amount of charge is transferred to the gate, is commensurate with the first voltage so as to cause the semiconductor device to enter the first device state, and the charge is supplied to a circuit node coupled to the gate with a time behavior characterized by a sufficiently high initial voltage to overcome a complex impedance that exists between the circuit node and the gate.

Some embodiments use first and second capacitors, which are selectively connected to the circuit node after being charged by connection to respective voltage sources (one for charging and one for discharging). Other embodiments use a single capacitor that is always connected to the circuit node, and the charge transfer occurs when the other side of the capacitor is selectively coupled to the voltage source.

Another aspect of the invention provides a circuit comprising a voltage source supplying a third voltage that is significantly higher than the first voltage, a charge storage device having first and second nodes with the first node connected to a circuit node coupled to the gate, switching circuitry for selectively connecting the second node of the charge storage device to the voltage source, and control circuitry, coupled to the switching circuitry and responsive to an input signal.

When the input signal signifies at transition to the first device state, the switching circuitry connects the voltage source to the second node of the charge storage device, and the charge storage device transfers an amount of charge characteristic of the charge storage device and the voltage source to the gate. The charge storage device and the third voltage are chosen so that the voltage on the gate, after the amount of charge is transferred to the gate, is commensurate with the first voltage so as to cause the semiconductor device to enter the first device state, and the charge is supplied to the circuit node coupled to the gate with a time behavior characterized by a sufficiently high initial voltage to overcome a complex impedance that exists between the circuit node and the gate.

Another aspect of the invention provides a method comprising providing a voltage source supplying a third voltage that is significantly higher than the first voltage, providing a charge storage device having first and second nodes with the first node connected to a circuit node coupled to the gate, in response to an input signal specifying a transition from the second device state to the first device state, connecting the second node of the charge storage device to the voltage source, and transferring an amount of charge characteristic of the charge storage device and the voltage source to the gate. The charge storage device and the third voltage are chosen so that the voltage on the gate, after the amount of charge is transferred to the gate, is commensurate with the first voltage so as to cause the semiconductor device to enter the first device state, and the charge is supplied to the circuit node coupled to the gate with a time behavior characterized by a sufficiently high initial voltage to overcome a complex impedance that exists between the circuit node and the gate.

The method may also include, in response to an input signal specifying a transition from the first device state to the second device state, connecting the second node of the charge storage device to an additional voltage source, which may be ground or negative, but not necessarily of large absolute value.

Another aspect of the invention provides a circuit comprising a first voltage source, a first charge storage device, first switching circuitry, second switching circuitry, and control circuitry. The first voltage source supplies a third voltage that is significantly higher than the first voltage, and the first switching circuitry selectively connects the first charge storage device to the first voltage source. The second switching circuitry selectively connects the first storage device to the gate. The control circuitry is coupled to the first and second switching circuitry and is responsive to an input signal to establish first and second circuit states.

When the circuit enters the first circuit state, the first switching circuitry connects the first voltage source to the first charge storage device while the second switching circuitry isolates the first charge storage device from the gate. This causes the first storage device to be charged to the third voltage.

When the circuit enters the second circuit state, the first switching circuitry isolates the first voltage source from the first charge storage device while the second switching circuitry connects the first charge storage device to the gate, whereupon the first charge storage device transfers a significant portion of its charge to the gate. The capacity of the first charge storage device and the third voltage are chosen so that the voltage on the gate, after the charge transfer, is commensurate with the first voltage so as to cause the semiconductor device to enter the first device state. This results in very rapid switching from the first state to the second state.

Some embodiments include additional elements to hold the gate at the first voltage after the first charge storage device has transferred a significant portion of its charge to the gate. These include a voltage source supplying a voltage equal to the second voltage, and switching circuitry for selectively coupling the gate to the voltage source while the second switching circuitry again isolates the first charge storage device from the gate.

Some embodiments include additional elements to effect rapid switching from the second state to the first state. These include a second voltage source supplying a fourth voltage that is significantly lower than the second voltage, a second charge storage device, third switching circuitry for selectively connecting the second charge storage device to the second voltage source, and fourth switching circuitry for selectively connecting the second storage device to the gate. The control circuitry establishes circuit states where the second storage device is charged to the fourth voltage and where the gate rapidly transfers a significant portion of its charge to the second storage device.

Another aspect of the invention provides a method comprising: charging a first capacitor to a third voltage that is significantly higher than the first voltage while keeping the first capacitor decoupled from the gate; and thereafter, connecting the first capacitor to the gate so that the first capacitor transfers a significant portion of its charge to the gate. The first capacitor and the third voltage are chosen so that the voltage on the gate, after the charge transfer, is commensurate with the first voltage so as to cause the device to enter the first state.

Some embodiments include additional steps to effect rapid switching from the second state to the first state. These include charging a second capacitor to a fourth voltage that is significantly lower than the second voltage while keeping the second capacitor decoupled from the gate; and thereafter, connecting the second capacitor to the gate so that the gate transfers a significant portion of its charge to the second capacitor. The second capacitor and the fourth voltage are chosen so that the voltage on the gate, after the charge transfer, is commensurate with the second voltage so as to cause the device to enter the second state.

A further understanding of the nature and advantages of the present invention may be realized by reference to the remaining portions of the specification and the drawings.

DESCRIPTION OF SPECIFIC EMBODIMENTS

Introduction

Embodiments of the present invention provide circuits and methods for rapidly switching gated semiconductor devices. Two embodiments are described below. The first embodiment is described with reference to FIG. 1 through FIG. 4 while the second embodiment is described with reference to FIG. 5 through FIG. 8. The specific cases described are where a positive voltage on the gate causes the device to change state and a larger positive voltage is used to speed up the transition. However, it is contemplated that there may be instances where a negative voltage is used to cause the state change and a more negative voltage is used to speed up the transition. For ease of nomenclature, a statement that a voltage is higher than another should be understood to cover a case of a negative voltage whose absolute voltage value is greater than that of the other voltage.

First Embodiment

Circuit Overview

Figure 1:
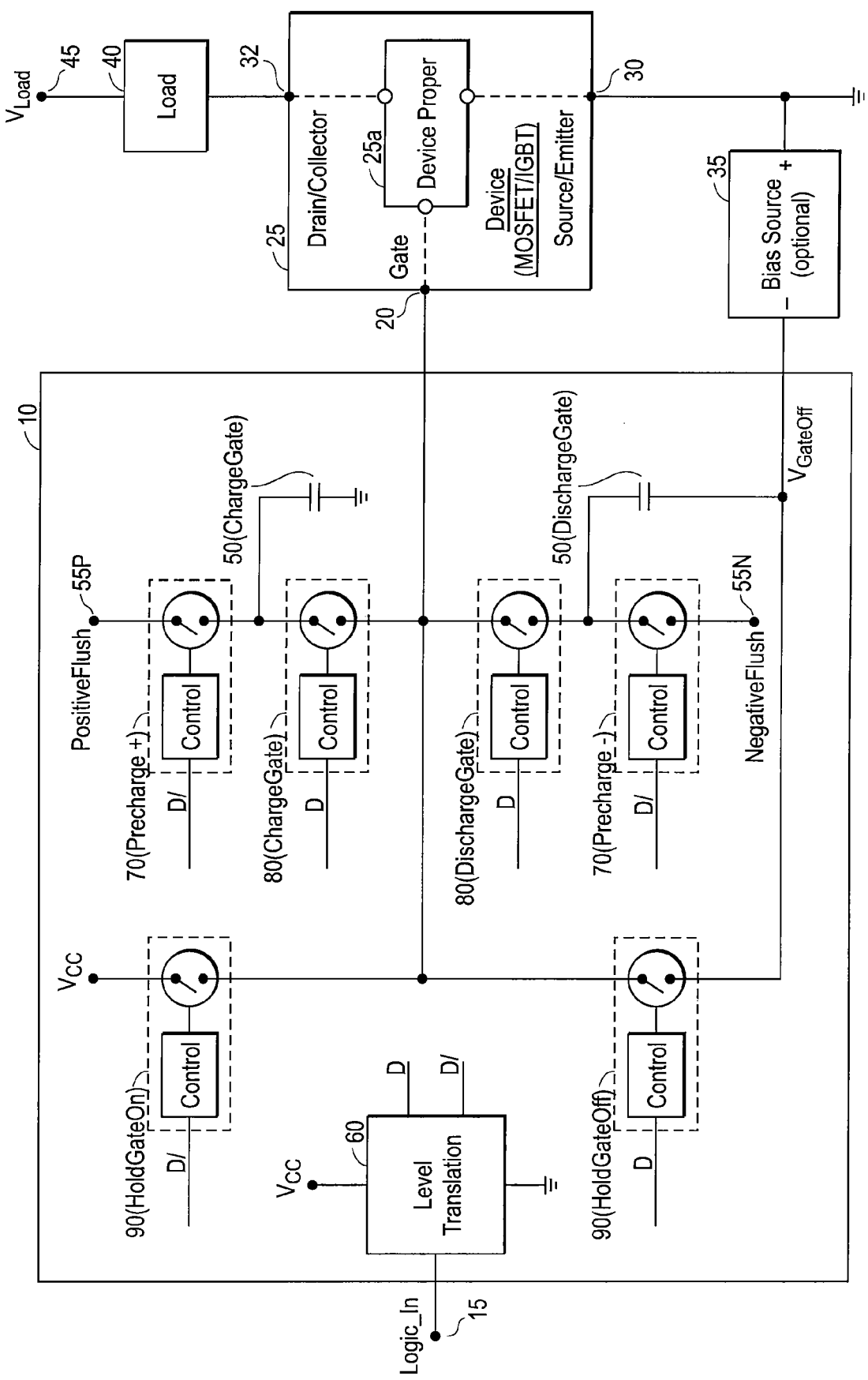
FIG. 1 is a high-level block diagram of a gate drive circuit according to a first embodiment of the present invention.

FIG. 1 is a high-level block diagram of a gate drive circuit 10 according to the first embodiment of the present invention. In short, circuit 10 responds to a signal at a Logic_In input 15 and drives the gate node (terminal) 20 of a semiconductor device 25 (often referred to simply as "the device") in response to that signal. The device may be a field effect transistor (FET) or an insulated gate bipolar transistor (IGBT). The device is shown as having two additional nodes (terminals) 30 and 32. Terminal 30 is shown connected to ground while terminal 32 is shown connected to one terminal of a load 40, the other terminal of which is connected to a voltage supply 45 ($V_{LOAD}$).

As mentioned above, a number of factors limit the rate at which the device gate can be charged. These include the Miller Effect, and various inductances (e.g., drain, source, package, and interconnect). As will be described in detail below embodiments of the present invention charge the gate more quickly by using a larger initial voltage to start current flow, thus mitigating the above factors.

The drawing illustrates, at a high level, the notion that the terminals seen by the gate drive circuit are coupled via communication paths to corresponding structures of the actual semiconductor device (the "device proper"), which is designated 25a. The gate drive circuit is designed to turn the actual device gate on and off by supplying suitable voltages to the gate node on the device package. The communication paths are shown in dashed lines, and the device gate, source, and drain (for a MOSFET) are shown schematically as hollow circles.

The gate will sometimes be referred to as the gate proper to distinguish it from gate node 20. The dashed paths are the source of complex impedances that limit the rate at which a voltage change at gate node 20 is communicated to the gate proper to charge or discharge the gate proper. The distinction between the gate node and the gate proper is significant in some contexts and not others. The distinction is most significant since the gate drive circuit applies an initial voltage to the gate terminal that is larger than could be safely applied to the gate proper.

Circuit 10 is shown as having a supply voltage $V_{CC}$ and ground. The device is characterized by a full enhancement voltage, i.e., the gate voltage required to turn the device fully on, and $V_{CC}$ will typically be chosen to be slightly above (say a volt or two above) the device's full enhancement voltage. In some instances, gate turn-off is accomplished by applying a voltage, designated $V_{GATEOFF}$, below the source voltage (ground), which can be provided by an optional bias source 35. The use of galvanic isolation in this section allows the use of an optional bias source to provide negative gate bias commonly used in high voltage FET and IGBT circuits.

If the device is an FET, terminals 30 and 32 are the source and drain, while if the device is an IGBT, terminals 30 and 32 are the emitter and collector. For convenience, the remaining description will be in terms of an n-channel MOSFET where the source is connected to ground, voltage supply 45 provides a positive voltage, and the MOSFET is turned on by a positive voltage applied to the gate proper via gate node 20. When a voltage on the order of $V_{CC}$ is applied to the gate, the device is turned on; when the gate is at ground (or the optional negative bias voltage), the device is off. It will be understood, however, that in the case of p-channel devices, a positive gate voltage will turn the device off, while a zero or negative gate voltage will turn the device on.

Circuit 10 comprises a number of subsystems as will be outlined below. In short, circuit 10 uses a pair of capacitors 50 (ChargeGate) and 50 (DischargeGate) to rapidly charge and discharge the gate. The capacitors are selectively precharged by respective positive and negative voltage supplies 55P and 55N, which provide voltages that are significantly higher in absolute value than other characteristic voltages in the system. This is accomplished by a number of controlled switch blocks, each of which is shown schematically as including a control block and a switch. A reference to a block being turned on or off should normally be interpreted to mean that the switch within that block is being turned on or off.

The voltages on supplies 55P and 55N are referred to as PositiveFlush and NegativeFlush, respectively, and are typically higher in absolute value than the maximum voltage that the gate can withstand. However, the capacitor values are chosen so that the total charge on the capacitors is sufficiently small that when the charge is transferred to/from the gate, the voltage on the gate will be within the levels that the device can tolerate. The particular voltage values and capacitor values are chosen in view of the packaging and interconnect, and the absolute voltage value can vary, say between several 10's of volts to more than 1000V. For example, if the circuit must be mounted far from the actual device, this may require a very small capacitor with a very high voltage to overcome the inductance but not overshoot the target value for the gate voltage.

A level translation circuit 60, which may include a Schmitt trigger, receives the signal at Logic_In input 15 and generates a representation of that signal translated from logic levels to gate drive levels. The level translation circuit preferably also provides better defined edges. The representative signal is provided as a pair of complementary signals D and D/. D assumes one of $V_{CC}$ and ground (actually a voltage that is slightly above ground by a saturation voltage of a transistor), and D/assumes the other. The other elements in circuit 10 use these signals to charge and discharge gate 20 much faster than the characteristic rise and fall times of the D and D/signals. In down-to-earth terms, the circuit sharpens a rather dull edge to a knife edge to charge and discharge the gate.

A switch block 70 (precharge +), when turned on, connects capacitor 50 (ChargeGate) to supply 55P to permit precharging of the capacitor to the voltage on supply 55P. A switch block 70 (precharge −), when turned on, connects capacitor 50 (DischargeGate) to supply 55N to permit precharging of the capacitor to the voltage on supply 55N.

A switch block 80 (ChargeGate), when turned on, connects capacitor 50 (ChargeGate) to gate 20 to permit charging the gate. As will be described below, capacitor 50 (ChargeGate), while charged to the high voltage on supply 55P (e.g., +100V), does not expose the gate to this voltage; to do so would cause punch-through. Rather, the capacitor is sufficiently small so that the amount of charge, when transferred to the gate, charges the gate to a voltage that is sufficient for a full turn-on (say a voltage on the order of $V_{CC}$). Similarly, a switch block 80 (DischargeGate), when turned on, connects capacitor 50 (DischargeGate) to gate 20 to permit discharging the gate to the capacitor. Again, capacitor 50 (DischargeGate), while charged to the high absolute-value voltage on supply 55N (e.g., −100V), does not expose the gate to this voltage.

A switch block 90 (HoldGateOn), when turned on, provides a low-impedance path between gate node 20 and $V_{CC}$. Similarly, a switch block 90 (HoldGateOff), when turned on, provides a low-impedance path between gate node 20 and ground. These switch blocks ensure stable levels on the gate between transitions, although this might be unnecessary in some situations where the gate, once charged or discharged, remains in that state in the absence of intervention. Thus these switch blocks should be considered preferred rather than necessary.

First Embodiment

State Changes

Figure 2A:
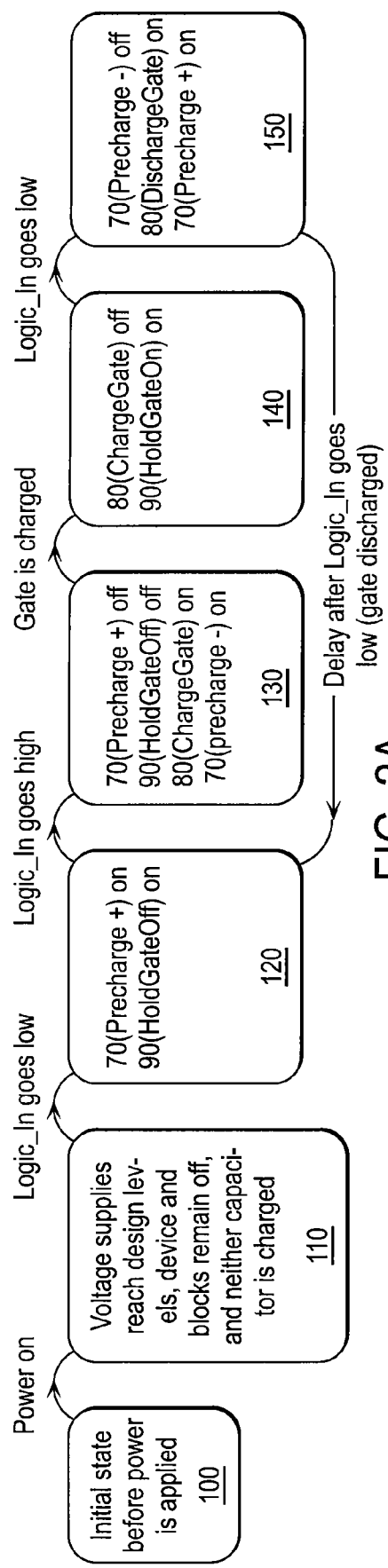
FIG. 2A and FIG. 2B provide a state transition diagram of the gate drive circuit of FIG. 1.
Figure 2B:
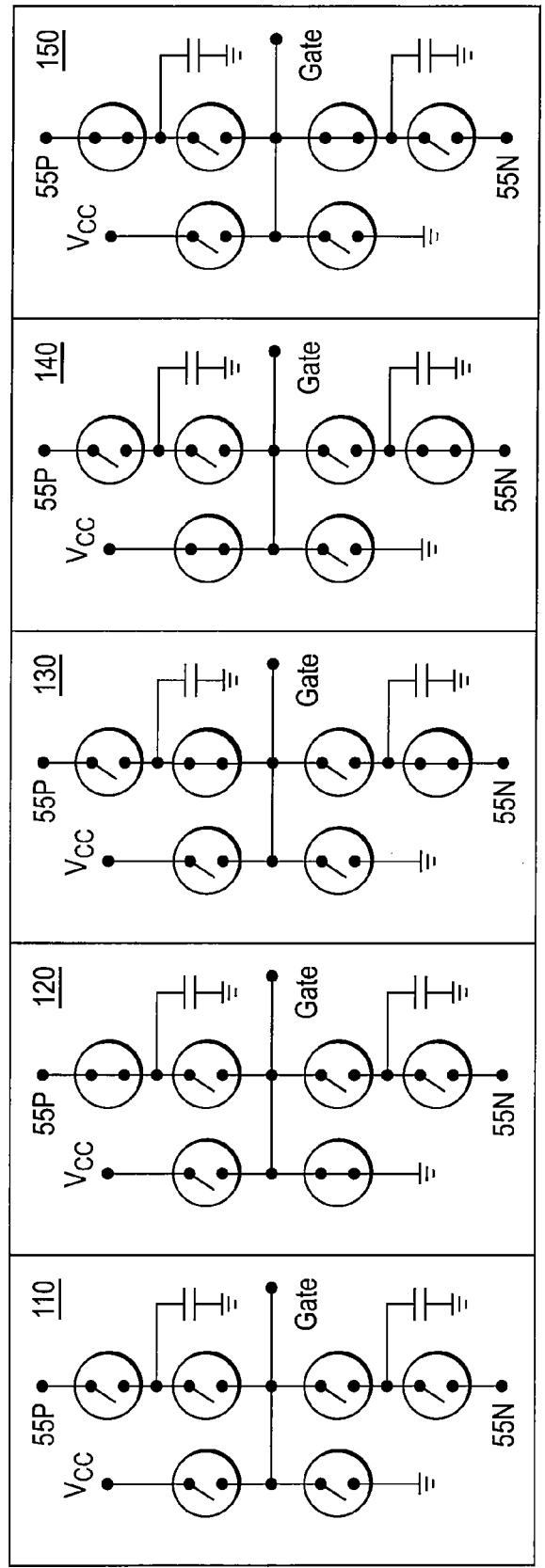

FIG. 2A and FIG. 2B provide a state transition diagram of circuit 10 and device 25. The reasons for the state transitions in response to specific triggering events will not be described at this point, but will become clear in view of a later description of the circuitry in a particular embodiment. FIG. 2A shows the states and state transitions while FIG. 2B shows schematically the states of the switching blocks in each state. In an initial state 100 before power is applied to the system, there is no charge on any of the capacitors and device 25 is off. All the switch blocks are off (this state is not shown in FIG. 2B).

When power is turned on, the system transitions to a state 110 where the voltage supplies reach their designated voltages (Vcc, PositiveFlush, and NegativeFlush), the device and the blocks remain off, and neither capacitor is charged. However, Logic_In is low, which means that D is low and D/is high.

This causes a transition to a state 120 where switch blocks 70 (precharge +) and 90 (HoldGateOff) are turned on. Turning on switch block 70 (precharge +) starts the charging of capacitor 50; turning on switch block 90 (HoldGateOff) holds the gate at ground and keeps the device off.

When Logic_In goes high, the system transitions to a state 130 where switch blocks 70 (precharge +) and 90 (HoldGateOff) are turned off, thereby stopping the charging of capacitor 50 (ChargeGate) and decoupling the gate from ground. This transition then turns switch block 80 (ChargeGate) on. The initially high voltage at gate node 20 overcomes the complex impedances between the gate node and the gate proper. This allows a high current charge transfer from capacitor 50 (ChargeGate) to the gate, but the high voltage at the gate node decays without being seen by the gate. Switch block 70 (precharge −) is also turned on to commence charging capacitor 50 (DischargeGate) in preparation for the next time Logic_In goes low. At some point during the discharge of capacitor 50 (ChargeGate) in state 130, the voltage on the capacitor has fallen below a certain level (about two diode drops below $V_{CC}$ in the specific embodiment) and the gate is sufficiently charged to turn device 25 on.

The drop in the voltage on capacitor 50 (ChargeGate) causes a transition to a state 140 where switch block 80 (ChargeGate) turns off and switch block 90 (HoldGateOn) turns on, which provides a low impedance path between the gate and $V_{CC}$ to keep the gate charged and keep the device on.

When Logic_In goes low, the system transitions to a state 150 where switch blocks 90 (HoldGateOn) and 70 (precharge −) are turned off, thereby stopping the charging of capacitor 50 (DischargeGate) and decoupling the gate from $V_{CC}$. Thereafter switch block 80 (DischargeGate) is turned on. This allows a high current charge transfer from the gate to capacitor 50 (DischargeGate). Switch block 70 (precharge +) is also turned on to commence charging capacitor 50 (ChargeGate) in preparation for the next time Logic_In goes low.

A delayed response to Logic_In going low, timed to allow completion of the transfer of the gate charge to capacitor 50 (DischargeGate), causes the circuit to transition back to state 120, which was also entered in response to the initial Logic_In going low after power on.

It is noted that states 110, 120, 130, 140, and 150 are circuit states, which are different from the device ON and OFF states. In many instances, such as the description above, the context dictates whether a state that is referred to is a circuit state or a device state. In other contexts, it may be convenient to precede the mention of a state with the adjective "device" or "circuit" depending on the nature of the state being referred to.

First Embodiment

Circuit Details and Operation

Figure 3A:
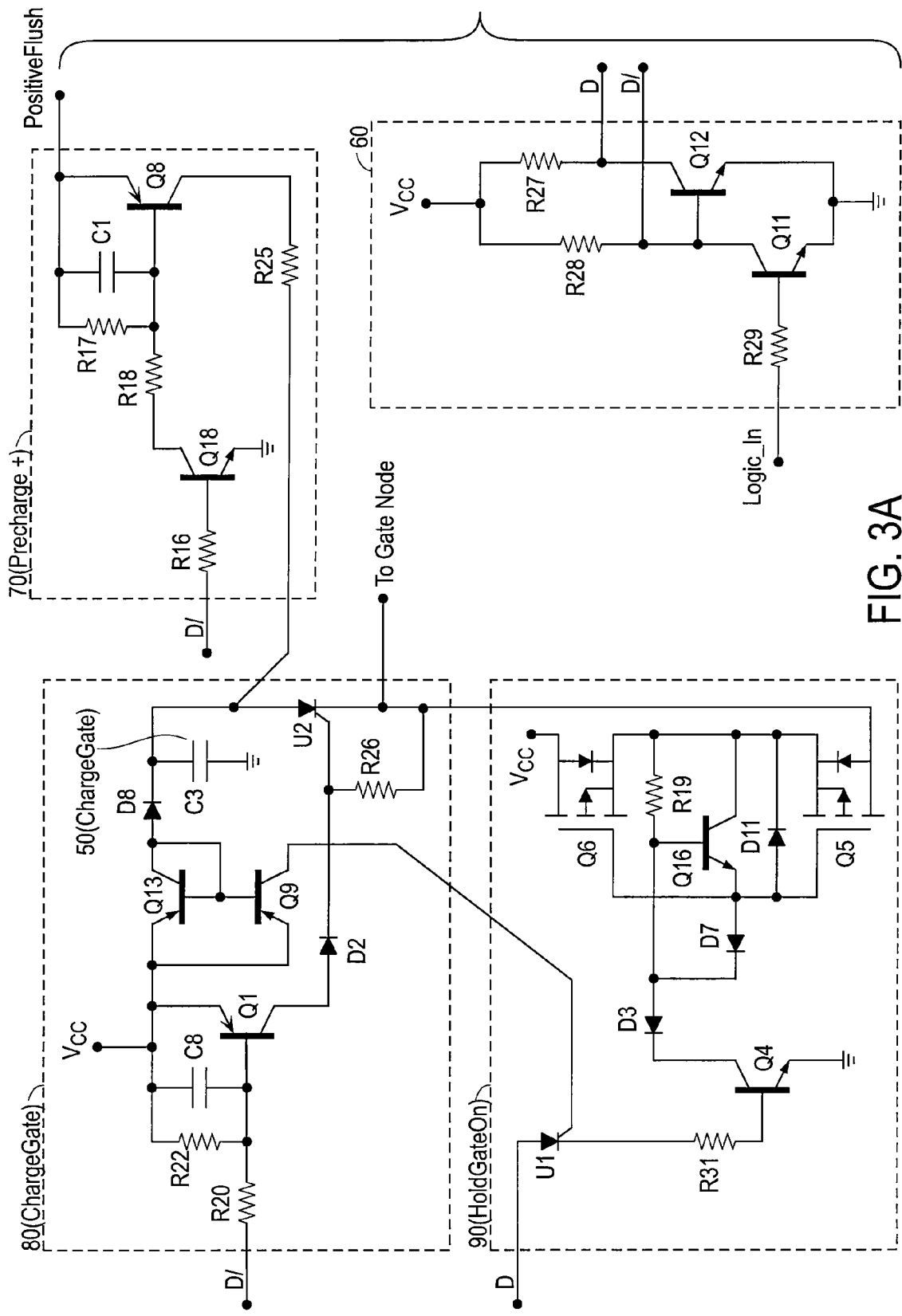
FIG. 3A is a circuit schematic of the portions of the gate drive circuit of FIG. 1 that are responsible for rapidly charging (turning on) the gate.
Figure 3B:
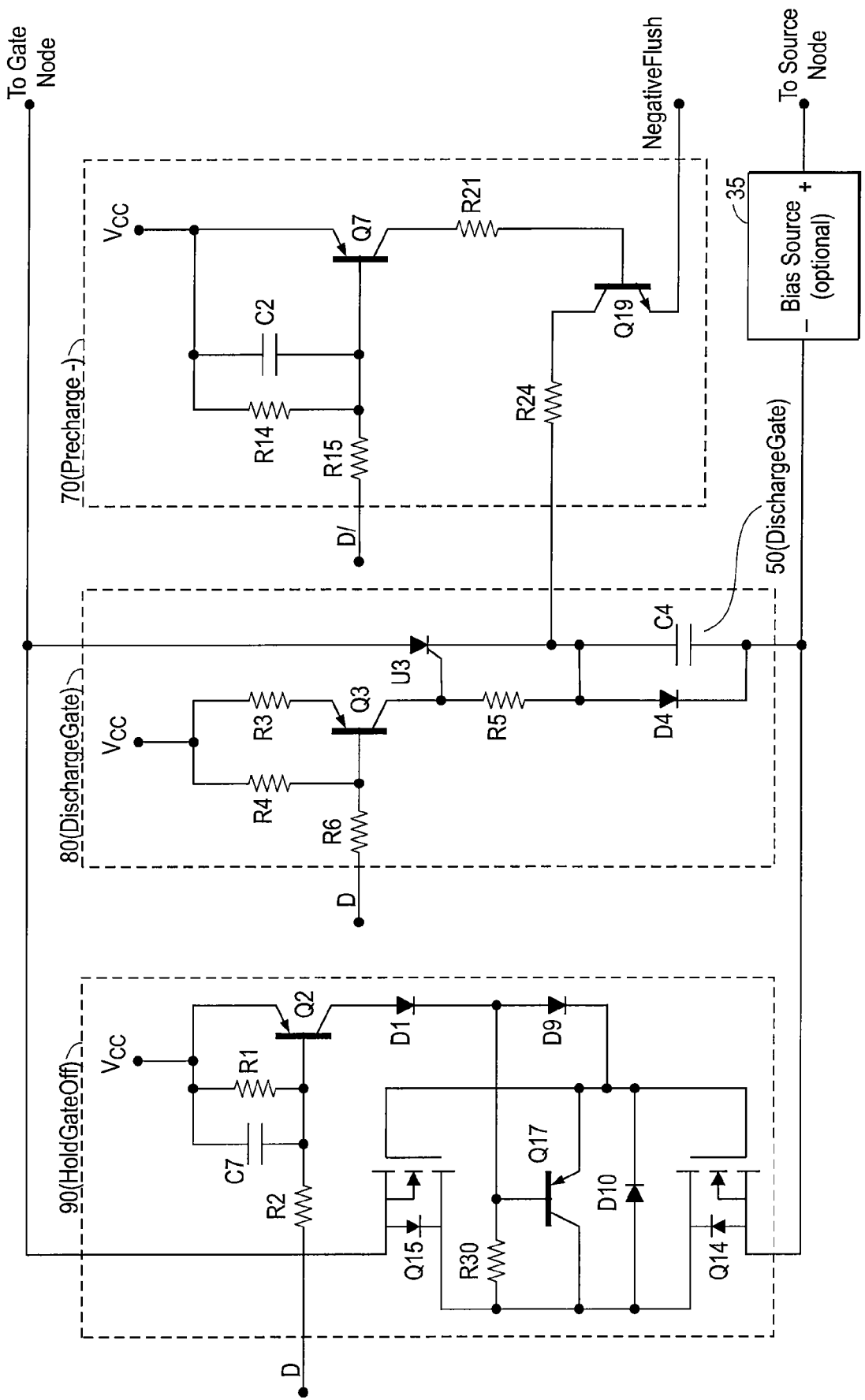
FIG. 3B is a circuit schematic of the portions of the gate drive circuit of FIG. 1 that are responsible for rapidly discharging (turning off) the gate.

FIG. 3A and FIG. 3B are circuit schematics showing a specific implementation of gate drive circuit 10 as shown in FIG. 1, with FIG. 3A showing the portions of the gate drive circuit that are responsible for rapidly charging (turning on) the gate and FIG. 3B showing the portions of the gate drive circuit that are responsible for rapidly discharging (turning off) the gate.

FIG. 3A shows level translation circuit 60, switch block 70 (precharge +), switch block 80 (ChargeGate), and switch block 90 (HoldGateOn). In switch block 70 (precharge +), a transistor Q18 is used to level shift and turn on a transistor Q8 after a small delay. Transistor Q8 is used to control the pre-charging of capacitor 50 (ChargeGate). The pre-charging does not occur until capacitor 50 (ChargeGate) has been discharged and the device is turning off.

A transistor Q in switch block 80 (ChargeGate) is used to trigger an SCR U2 through a diode D2, which protects transistor Q1 from the rapid rise of the voltage at the gate of SCR U2 to the voltage on capacitor 50 (ChargeGate). This occurs while the gate of the driven device's inductance fields form. A pair of transistors Q5 and Q6 in switch block 90 (HoldGateOn), PMOS transistors in this specific embodiment, provide the low impedance connection to the gate holding voltage once capacitor 50 (ChargeGate) has been discharged.

A pair of transistors Q9 and Q13 in switch block 90 (HoldGateOn) trigger SCR U1 once the voltage on capacitor 50 (ChargeGate) is at $V_{CC}$ minus the voltage drop across a diode D8. A transistor Q4 turns off a transistor Q16 and then charges the gates of transistors Q5 and Q6. A transistor Q16 effects a fast turn off of transistors Q5 and Q6 and should be a high gain (hfe) transistor to limit power loss in a resistor R19. The Vce seen by transistor Q16 never exceeds $V_{CC}$.

FIG. 3B shows switch block 70 (precharge –), switch block 80 (DischargeGate), and switch block 90 (HoldGateOff). Switch block 90 (HoldGateOff) provides a low impedance path to the gate turn off voltage source. It is delayed by a biasing network on a transistor Q2, so as to allow switch block 80 (DischargeGate) to complete the turn off of the device under control of the circuit. When transistor Q2 begins to conduct, it turns off a transistor Q17 and then charges the gates of transistors Q14 and Q15, NMOS transistors in this specific embodiment. Transistor Q17 effects a fast turn off of transistors Q14 and Q15 and should be a high gain (hfe) transistor to limit power loss in resistor R30. The Vce seen by transistor Q17 never exceeds $V_{CC}$.

Switch block 80 (DischargeGate) is the control for the discharging of capacitor 50 (DischargeGate) used to turn off the device under control of the circuit. When the control signal goes low, a transistor Q3 triggers an SCR U3 causing capacitor 50 (DischargeGate) to remove the charge from the gate.

Switch block 70 (precharge –) is the pre charging source for capacitor 50 (DischargeGate). A transistor Q7 turns on a transistor Q19 with a small delay after the circuit begins to turn on the device under circuit control. Transistor Q19 precharges capacitor 50 (DischargeGate) for the next turn off cycle.

Figure 4:
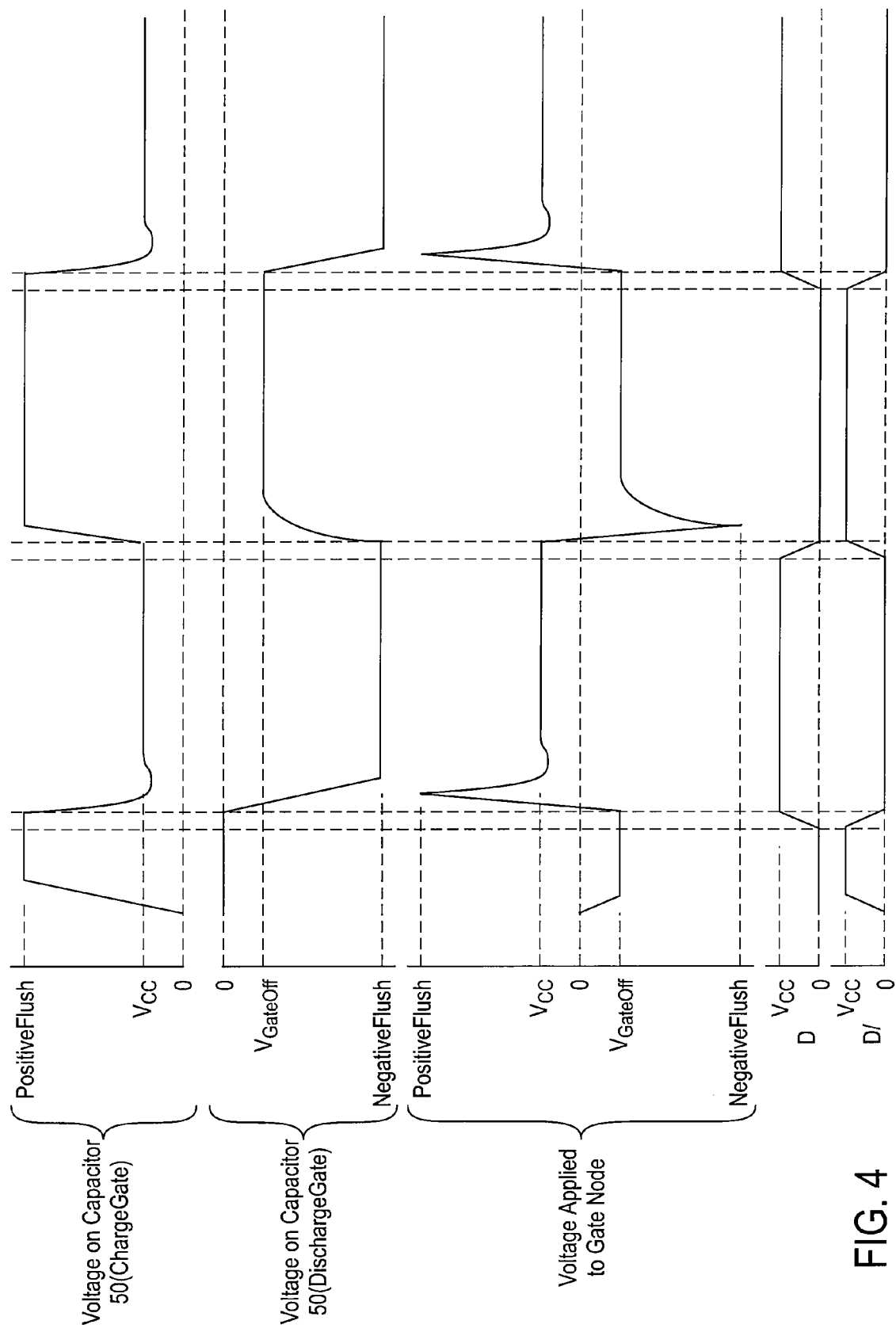
FIG. 4 is a simplified timing diagram for the gate drive circuit of FIG. 1, showing the voltages on the gate-charging and gate-discharging capacitors and on the gate node, referenced to the differential signal derived from the logic input signal for the gate drive circuit of FIG. 1.

FIG. 4 is a simplified timing diagram showing various voltages in the system. The bottom portion show the differential signal (D, D/) derived from the input signal at Logic_In input 15. The three portions starting from the top show the voltage on capacitor 50 (ChargeGate), capacitor 50 (DischargeGate), and the gate node. As noted above, when power is turned on, the voltage supplies reach their designated voltages ($V_{CC}$, PositiveFlush, and NegativeFlush), the device and the blocks remain off, and neither capacitor is charged. However, Logic_In is low, which means that D is low and D/is high. This initiates charging of capacitor 50 (ChargeGate) to PositiveFlush and the gate being pulled down to the negative bias voltage $V_{GATEOFF}$, if present, or the gate being held at ground.

The transition of D going high initiates a rapid transfer of charge from capacitor 50 (ChargeGate) to the gate. This is made possible by the initially high voltage on the gate node. In the meantime, capacitor 50 (DischargeGate) is being charged to the negative voltage NegativeFlush in preparation for the next transition of D going low, which initiates a rapid transfer of charge from the gate to capacitor 50 (DischargeGate).

First Embodiment

Determining the Gate Drive Parameters

Once the characteristics of the switched semiconductor device are known, it is relatively straightforward to determine the values for capacitors 50 (ChargeGate) and 50 (DischargeGate), and the values for PositiveFlush and NegativeFlush.

Gated devices (FETs and IGBTs) are often described as voltage controlled but are actually charge controlled. The conductance of the device is more a function of the total charge on the gate, which is different from the voltage. As is well known, for linear devices such as capacitors, the capacitance, charge, and voltage are related by the equation $V=Q/C$ (or equivalently, $C=Q/V$) where V is the voltage in volts, Q is the charge in coulombs, and C is the capacitance in farads. For gated devices, while the gate operates to store charge, it generally cannot be represented as a simple capacitor. Rather, complex impedances cause significant non-linearities in the voltage as a function of charge.

The actual maximum rate of change of charge on the gate of a device is not really known, as the best method of charging a gate to date has been to provide a very low impedance path to a voltage source at the desired final gate voltage. Some device designs have used a negative bias supply to help remove the tails of the turn off current but that still uses a DC voltage applied to the gate. For any given device there is a maximum gate current that the device can tolerate and a maximum voltage between the gate and the source that the device can tolerate without breaking down.

Thus, relevant device characteristics include:
the full enhancement voltage, which is the gate voltage required to turn the device fully on;
the full enhancement charge, which is the amount of charge required to turn the device fully on;
the gate punch-through voltage, which is the maximum voltage that the gate can withstand without breaking down;
the maximum current that can be allowed to flow into or out of the gate without causing damage; and
the gate impedance.

Of these quantities, the maximum current is not normally specified by the device manufacturer, but can be determined by testing the device The analysis for charging the gate from capacitor 50 (ChargeGate) will be discussed, it being understood that similar considerations apply to the discharging to capacitor 50 (DischargeGate). For brevity, voltage PositiveFlush will be referred to as V++ and the value of capacitor 50 (ChargeGate) will be referred to as $C_{CG}$. As mentioned above, in turning the device on, the gate will be driven to voltage $V_{CC}$, which is slightly (say a volt or two) above the full enhancement voltage but below the punch-through voltage. The desired value of charge on the gate will be referred to as $Q_{GATE}$.

Prior to transferring charge to the gate, the total charge on capacitor 50 (ChargeGate) is $C_{CG}*V++$. If the gate were a simple capacitor, the result of transferring charge from capacitor 50 (ChargeGate) to gate 20 would be to equalize the voltages on the capacitor and the gate at $V_{CC}$. However, power flow and inductance in the system will cause the final voltage on the capacitor to be less than $V_{CC}$ and that fact is used to turn on SCR U1. The capacitor will likely end up at a lower voltage due to inductance, and SCR U1 will prevent the backflow of charge to the capacitor and will be filtered back to the holding rail ($V_{CC}$) through the bilateral holding switch defined by transistors Q5, Q6, and Q16.

Therefore, a reasonable approximation is as follows:

$$C_{CG} * V{++} \approx Q_{GATE} \qquad (1)$$

Setting this constraint provides a safety margin and simplifies the calculation. More important to the user is the inductance between capacitor 50 (ChargeGate) and the gate proper. This inductance will cause an additional amount of charge to be transferred to the gate. However the now lower voltage at gate node 20 provides negative feedback to quickly quench the current spike in the actual device gate while block 90 transitions to the ON state.

This sets a constraint on $C_{CG}$ and V++, but does not uniquely determine them. However, since it is desired to charge the gate as quickly as possible, V++ is preferably chosen so that the initial current $I_{INITIAL}$ is slightly below the device's maximum tolerable gate current value with appropriate device tolerance margin. If the system level gate impedance is Z, $$V{++} = I_{INITIAL} * Z \qquad (2)$$

Substituting this into Equation 1 and rearranging leads to:

$$C_{CG} = Q_{GATE} / (I_{INITIAL} * Z) \qquad (3)$$

Consider the following possible example for a given device:

| | |
|---|---|
| $V_{CC}$ | 12 volts |
| $Q_{GATE}$ | 2600 nanocoulombs |
| Z | 1 ohm |
| $I_{INITIAL}$ | 250 amperes |

Note that $V_{CC}$ and $Q_{GATE}$ are not per se specified device characteristics, but rather are values that are based on the full enhancement voltage and the full enhancement charge. For example, the design choice of 12 volts for $V_{CC}$ might be based on a specified full enhancement voltage of 10 volts, i.e., 20% higher. While the gate is not a linear capacitor during the time it is being charged, it is a reasonable to assume a value for $Q_{GATE}$ that is also higher than the full enhancement charge. Similarly, $I_{INITIAL}$ is chosen to be lower than the tested maximum current for the device.

Substituting the "device-dependent" values of $I_{INITIAL}$ and Z into Equation 2 leads to a value for V++ of (250 amps)*(1 ohm)=250 volts. Substituting this value, along with the "device-dependent" values of $Q_{GATE}$ and $V_{CC}$, into Equation 3 leads to a value for $C_{CG}$ of (2600 nanocoulombs)/(250 volts), or 10.4 nanofarads.

Second Embodiment

Circuit Overview

Figure 5:
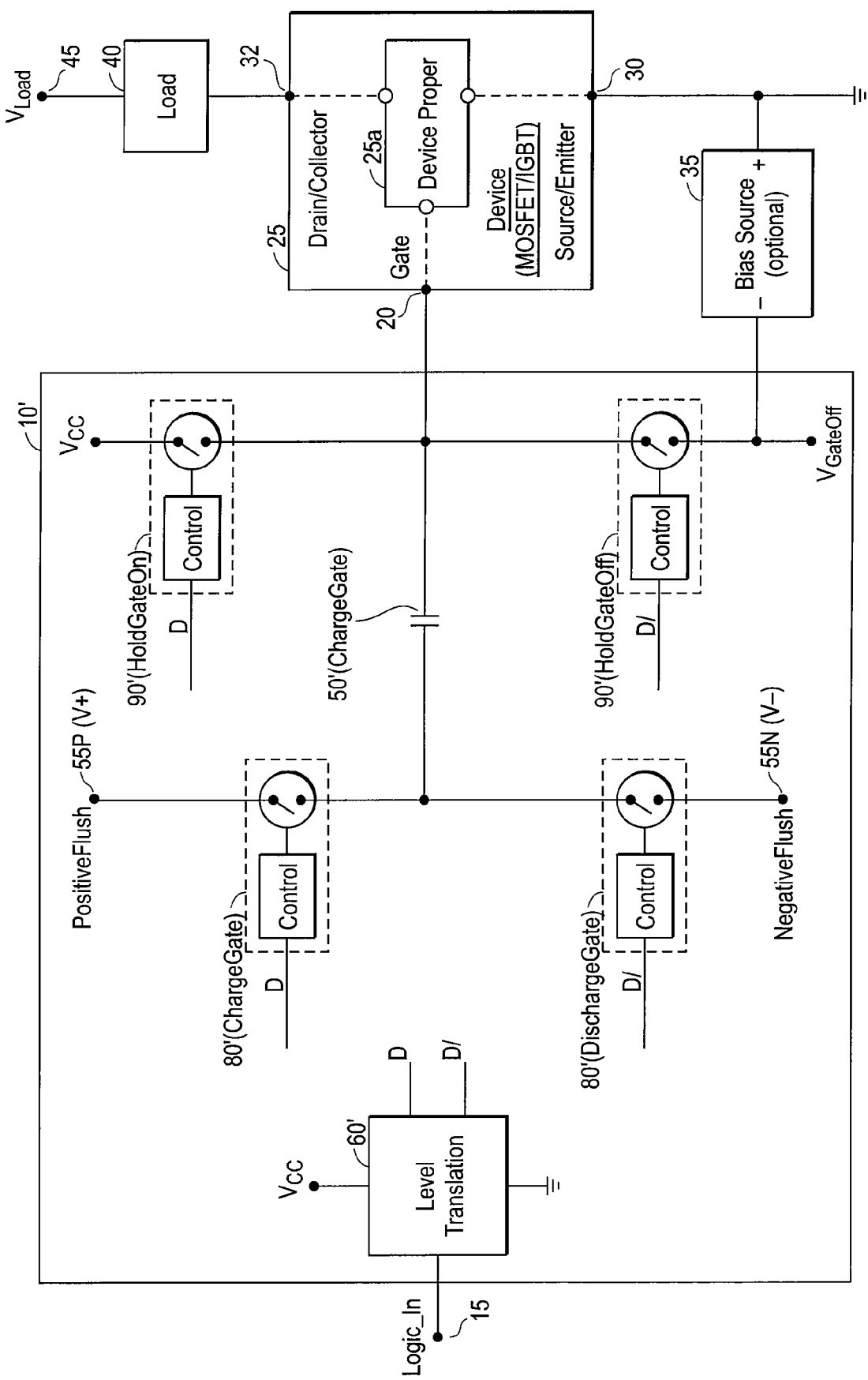
FIG. 5 is a high-level block diagram of a gate drive circuit according to a second embodiment of the present invention.

FIG. 5 is a high-level block diagram of a gate drive circuit 10' according to the second embodiment of the present invention. Elements in circuit 10' corresponding generally to those in circuit 10 of the first embodiment will be denoted by the same reference numbers, but primed. As with the first embodiment, circuit 10' responds to a signal at a Logic_In input 15 and drives gate node 20 of semiconductor device 25 in response to that signal. The comments regarding device 25 and its characteristics and operating environment made in connection with the description of the first embodiment will not be repeated here unless something differs by virtue of differences between the first and second embodiments.

Circuit 10' comprises a number of subsystems as will be outlined below. In short, circuit 10' differs from circuit 10 of the first embodiment in the following respects:

- a single capacitor 50' rather than capacitors 50 (ChargeGate) and 50 (DischargeGate);
- capacitor 50' is always connected to gate node 20;
- the NegativeFlush voltage need not have a large absolute value, but can be ground (or $V_{GATEOFF}$); and
- no counterparts to blocks 70 (precharge +) and 70 (precharge −).

Thus, circuit 10' uses a single capacitor 50' (value $C_{CG}$) to rapidly charge and discharge the gate. The capacitor is connected to gate node 20, and then is selectively charged by connection of the non-gate side of the capacitor to respective positive and negative voltage supplies 55P and 55N. In the specific embodiment, supply 55P provides a voltage that is significantly higher in absolute value than other characteristic voltages in the system, and supply 55N is ground or $V_{GATEOFF}$. This is accomplished by a number of controlled switch blocks, each of which is shown schematically as including a control block and a switch. A reference to a block being turned on or off should normally be interpreted to mean that the switch within that block is being turned on or off.

In the first embodiment, the voltages provided by voltage supplies 55P and 55N were referred to as PositiveFlush (or V++) and NegativeFlush, respectively, with both PositiveFlush and NegativeFlush being higher in absolute value than the maximum voltage that the gate can withstand. In this embodiment, voltage supply 55P provides a voltage, referred to as V+, that is typically higher in absolute value than the maximum voltage that the gate can withstand. Voltage supply 55N provides a voltage, designated V−, that is ground or $V_{GATEOFF}$ (if a negative bias supply is used).

Again, as in the case of the first embodiment, the value of capacitor 50' is chosen so that the total charge on the capacitor when charged to V+ is within the levels that the device can tolerate. The particular voltage value (V+) and capacitor value ($C_{CG}$) are chosen in view of the packaging and interconnect, and the absolute voltage value for V+ can vary, say between several 10's of volts to more than 1000V. For example, if the circuit must be mounted far from the actual device, this may require a very small capacitor with a very high voltage to overcome the extra inductance of the long connection path but not overshoot the target value for the gate voltage. Circuit 10' includes a level translation circuit 60', which operates in essentially the same manner as level translation circuit 60 in the first embodiment.

A switch block 80' (ChargeGate), when turned on, connects capacitor 50' to supply 55P, which charges the capacitor and hence the gate. As will be described below, capacitor 50', while charged to the high voltage on supply 55P (e.g., +100V), does not expose the gate to this voltage; to do so would cause punch-through. Rather, the capacitor is sufficiently small so that the amount of charge, when transferred to the gate, charges the gate to a voltage that is sufficient for a full turn-on (say a voltage on the order of $V_{CC}$). Similarly, a switch block 80' (DischargeGate), when turned on, connects capacitor 50' to supply 55N, which discharges the capacitor and hence the gate. By changing the voltage applied to the non-gate side of capacitor 50' (value $C_{CG}$) by $\Delta V$, the circuit transfers a charge of $C_{CG} * (\Delta V)$ to or from the gate node.

A switch block 90' (HoldGateOn), when turned on, provides a low-impedance path between gate node 20 and $V_{CC}$. Similarly, a switch block 90' (HoldGateOff), when turned on, provides a low-impedance path between gate node 20 and ground (or $V_{GATEOFF}$). These switch blocks ensure stable levels on the gate between transitions, although this might be unnecessary in some situations where the gate, once charged or discharged, remains in that state in the absence of intervention. Thus these switch blocks should be considered preferred rather than necessary.

Second Embodiment

State Changes

Figure 6A:
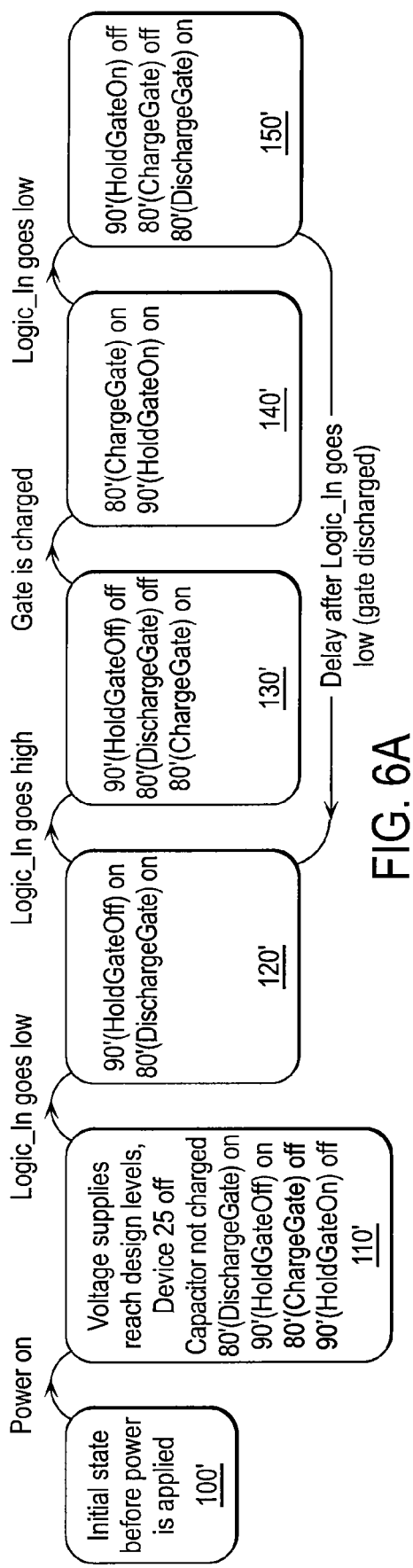
FIG. 6A and FIG. 6B provide a state transition diagram of the gate drive circuit of FIG. 5.
Figure 6B:
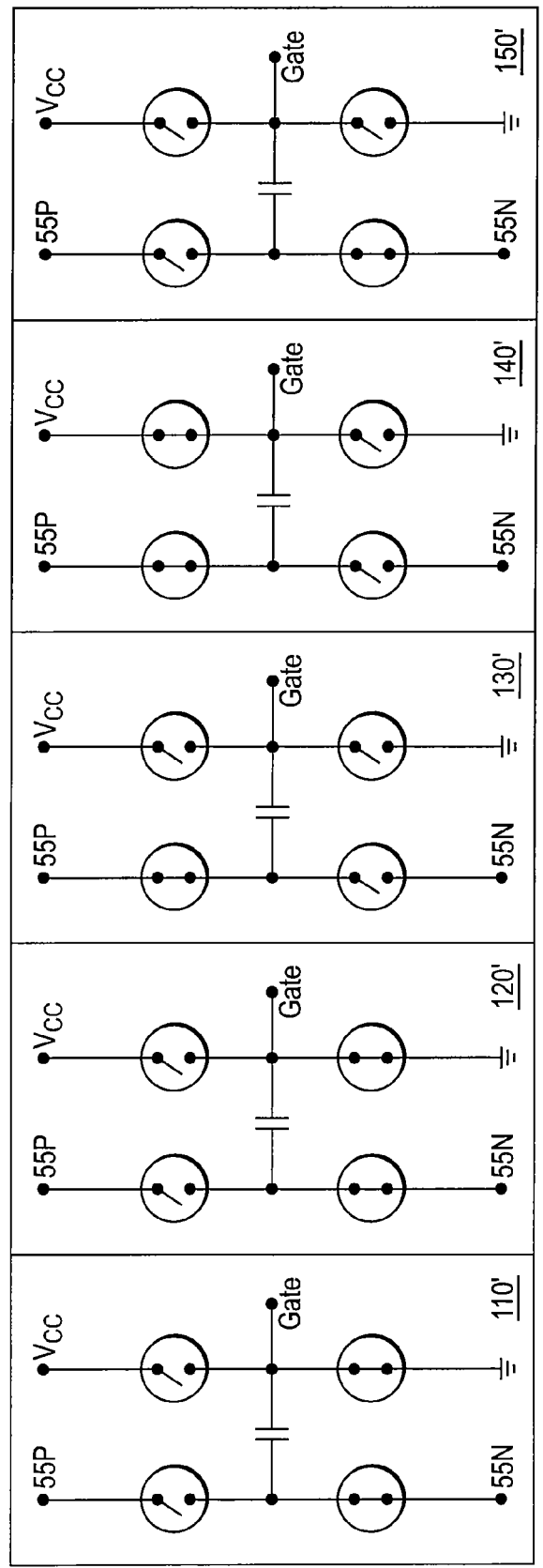

FIG. 6A and FIG. 6B provide a state transition diagram of circuit 10' and device 25. The reasons for the state transitions in response to specific triggering events will not be described at this point, but will become clear in view of a later description of the circuitry in a particular embodiment. FIG. 6A shows the states and state transitions while FIG. 6B shows schematically the states of the switching blocks in each state. In an initial state 100' before power is applied to the system, there is no charge on any of the capacitors and device 25 is off. All the switch blocks are off and there is no charge on capacitor 50' (this state is not shown in FIG. 6B).

When power is turned on, the system transitions to a state 110' where the voltage supplies reach their designated voltages ($V_{CC}$, V+, V−, and $V_{GATEOFF}$). In this state, switch blocks 90' (HoldGateOff) and 80' (DischargeGate) are on (switches closed) so that the gate is held off and capacitor 50' is discharged. Switch blocks 90' (HoldGateOn) and 80 (ChargeGate) are off (switches open).

When Logic_In goes low, which means that D is low and D/is high, this causes a transition to a state 120' where switch blocks 80' (DischargeGate) and 90' (HoldGateOff) are turned on. Turning on switch block 80' (DischargeGate) prevents the charging of capacitor 50'; turning on switch block 90' (HoldGateOff) holds the gate at ground and keeps the device off. As noted above, this may have been the condition before Logic_In went low, but state 120' is also entered during operation, and turning these two blocks on is necessary.

The overall control of the system delays the engagement of switch blocks 80' (ChargeGate) or 80' (DischargeGate) until the opposing switch blocks have both opened. Likewise the system delays the engagement of switch blocks 90' (HoldGateOn) or 90' (HoldGateOff) until semiconductor device 25 has changed states.

When Logic_In goes high, the system transitions to a state 130' where switch blocks 80' (DischargeGate) and 90' (HoldGateOff) are turned off, decoupling the gate and the capacitor from ground. This transition then turns switch block 80' (ChargeGate) on. The initially high voltage at gate node 20 overcomes the complex impedances between the gate node and the gate proper. This allows a high current charge transfer from capacitor 50' to the gate. At some point during the charge transfer of capacitor 50' in state 130, the voltage on the gate is sufficiently charged to turn device 25 on.

The change in the voltage on capacitor 50' causes a transition to a state 140' where switch block 90' (HoldGateOn) turns on, which provides a low impedance path between the gate and $V_{CC}$ to keep the gate charged and keep the device in the fully on state.

When Logic_In goes low, the system transitions to a state 150' where switch blocks 90' (HoldGateOn) and 80' (ChargeGate) are turned off, thereby stopping the charging of capacitor 50' and decoupling the gate from $V_{CC}$. Thereafter switch block 80' (DischargeGate) is turned on. This allows a high current charge transfer from the gate to capacitor 50'.

A delayed response to Logic_In going low, timed to allow completion of the transfer of the gate charge to capacitor 50', causes the circuit to transition back to state 120', which was also entered in response to the initial Logic_In going low after power on.

It is noted that states 110', 120', 130', 140', and 150' are circuit states, which are different from the device ON and OFF states. In many instances, such as the description above, the context dictates whether a state that is referred to is a circuit state or a device state. In other contexts, it may be convenient to precede the mention of a state with the adjective "device" or "circuit" depending on the nature of the state being referred to.

Second Embodiment

Circuit Details and Operation

Figure 7A:
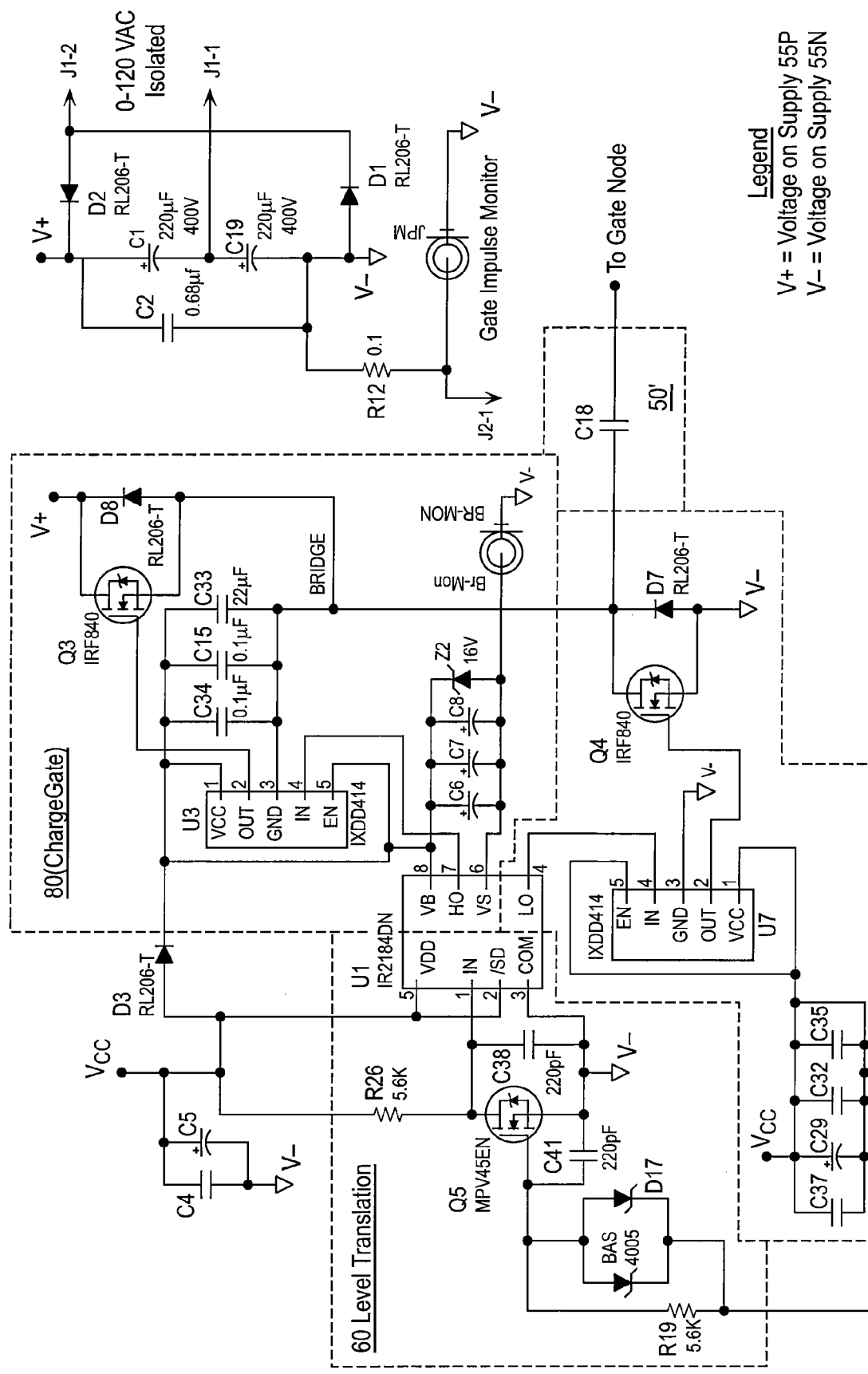
FIG. 7A is a circuit schematic of the portions of the gate drive circuit of FIG. 5 that are responsible for rapidly charging (turning on) and rapidly discharging (turning off) the gate.
Figure 7B:
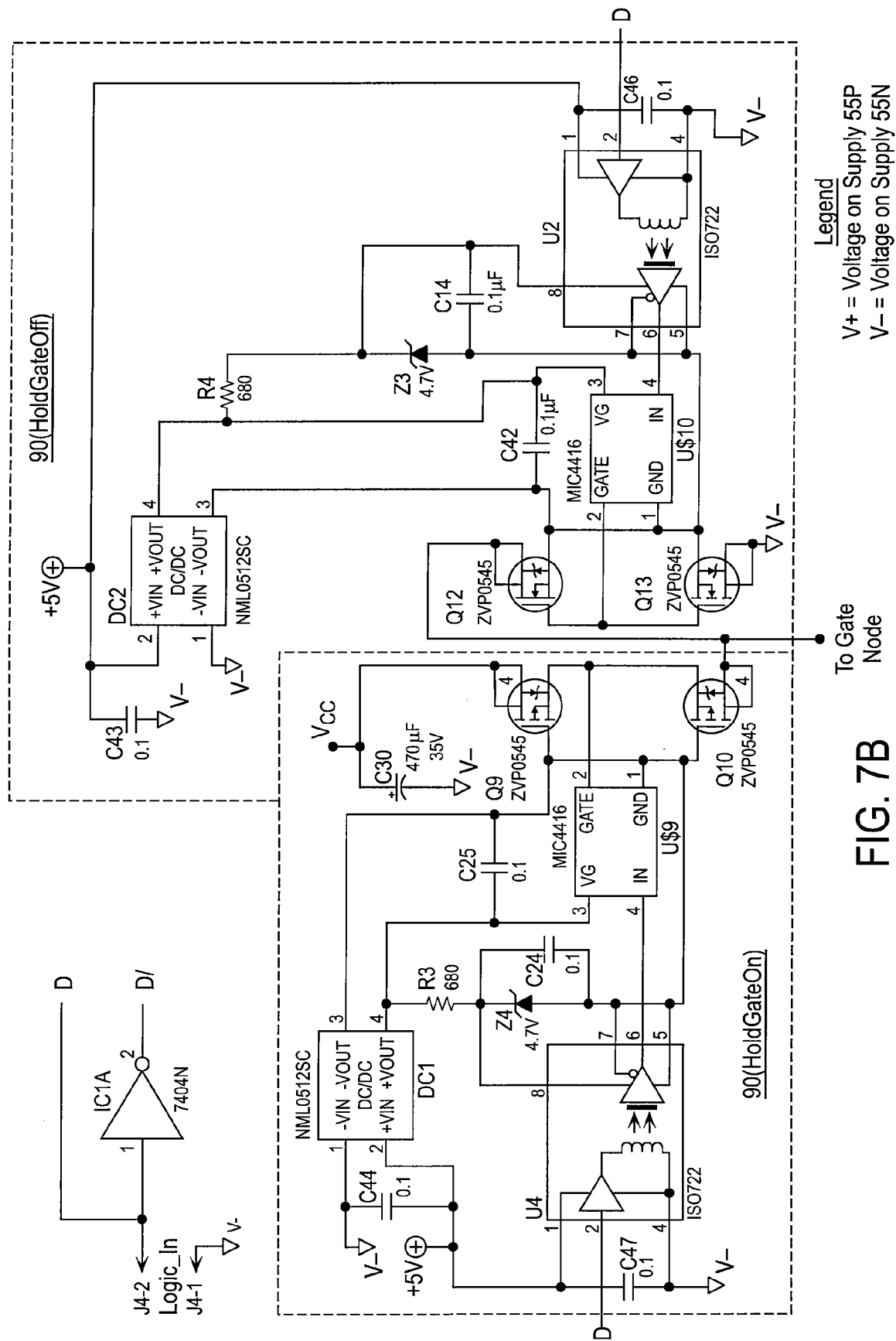
FIG. 7B is a circuit schematic of the portions of the gate drive circuit of FIG. 5 that are responsible for holding the gate on and off after the gate has been charged and discharged.

FIG. 7A and FIG. 7B are circuit schematics showing a specific implementation of gate drive circuit 10' as shown in FIG. 5, with FIG. 7A showing the portions of the gate drive circuit that are responsible for rapidly charging (turning on) and rapidly discharging (turning off) the gate, and FIG. 7B showing the portions of the gate drive circuit that are responsible for holding the gate on after the gate has been charged and holding the gate off after the gate has been discharged.

More specifically, FIG. 7A shows level translation circuit 60', switch block 80' (ChargeGate), and switch block 80' (DischargeGate), while FIG. 7B shows switch block 90' (HoldGateOn) and switch block 90' (HoldGateOff).

A transistor Q3 in switch block 80 (ChargeGate) transfers a quantity of charge to gate node 20 and ultimately to the gate proper. On completion of this transfer, switch block 90 (HoldGateOn) is engaged through a high-speed isolator U4. A pair of transistors Q9 and Q10 in switch block 90 (HoldGateOn), PMOS transistors in this specific embodiment, provide the low impedance connection to the gate holding voltage once the charge on capacitor 50' has been transferred to the gate.

Switch block 80' (ChargeGate) is used to charge capacitor 50'. This occurs while the gate of the driven device's inductance fields form. A pair of transistors Q9 and Q10 in switch block 90' (HoldGateOn), PMOS transistors in this specific embodiment, provide the low impedance connection to the gate holding voltage once capacitor 50' has been charged forming a charge divider between capacitor 50' and the gate of device 25. Fast control of the bilateral switch is effected using a high-performance gate drive chip U$9 with an isolated supply voltage (DC1) and isolated from other control components with a high speed digital isolator U4.

Switch block 90 (HoldGateOff) provides a low impedance path to the gate turn off voltage source. It is delayed by the system control so as to allow switch block 80 (DischargeGate) to complete the transfer of charge and turn off of the device under control of the circuit. Then, transistors Q12 and Q13, NMOS transistors in this specific embodiment, are turned on. Fast control of the bilateral switch is effected using a high-performance gate drive chip U$10 with an isolated supply voltage (DC2) and isolated from other control components with a high speed digital isolator U2.

Switch block 80' (DischargeGate) is the control for the discharging of capacitor 50' used to turn off the device under control of the circuit. When the control signal goes low, transistor Q4 is turned on causing capacitor 50' to remove a charge of $C_{CG}*(\Delta V)$ from the gate. Switch block 80 (DischargeGate) is the control for the transfer of charge in capacitor 50' through Q4 and subsequent engagement of 90' (Hold Gate Off) through U2.

Figure 8:
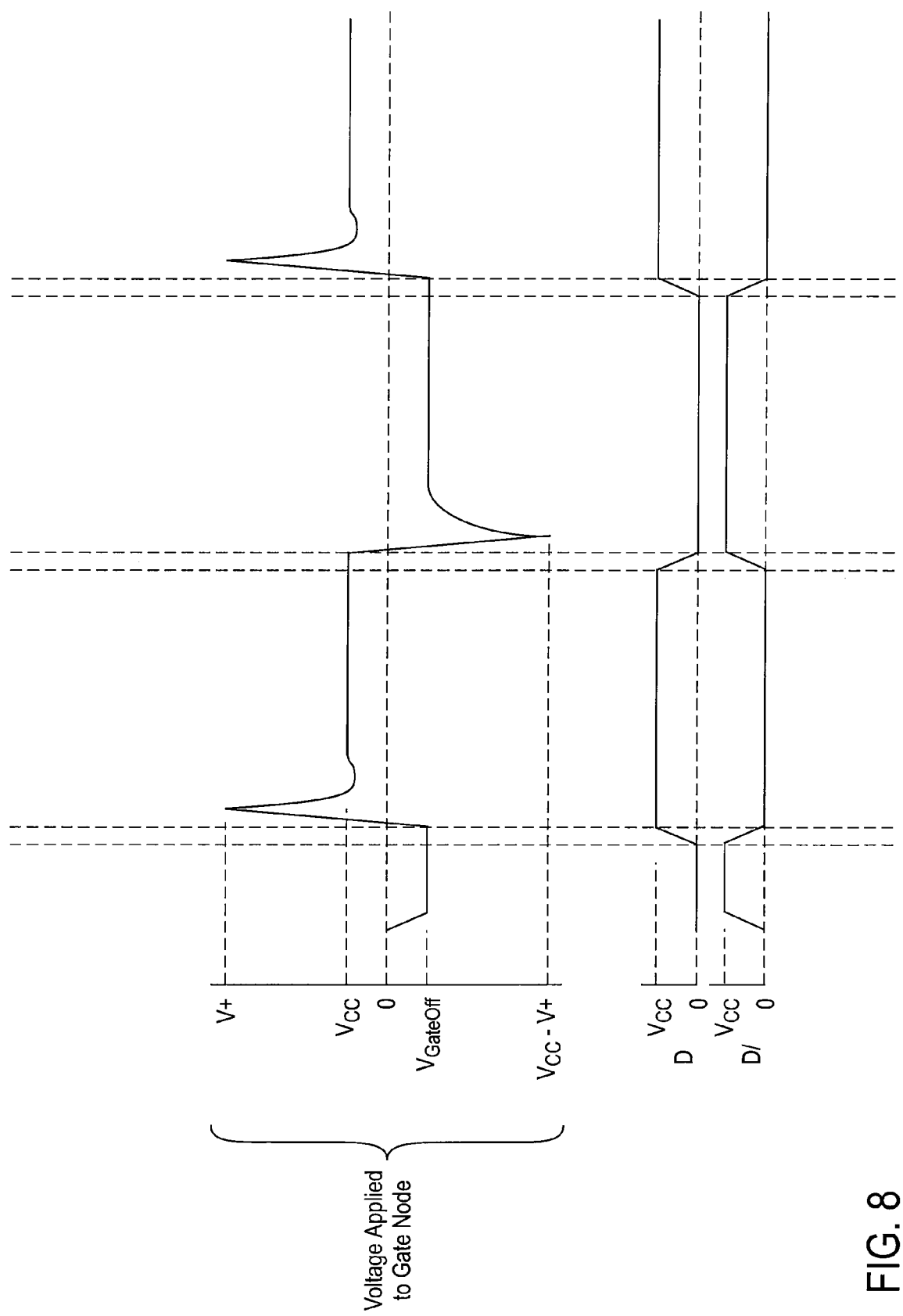
FIG. 8 is a simplified timing diagram for the gate drive circuit of FIG. 5, showing the voltages on the gate-charging/discharging capacitor and on the gate node, referenced to the differential signal derived from the logic input signal.

FIG. 8 is a simplified timing diagram showing various voltages in the system. The bottom portion shows the differential signal (D, D/) derived from the input signal at Logic_In input 15. The upper portion shows the voltage on capacitor 50', which is substantially communicated to the gate node. As noted above, when power is turned on, the voltage supplies reach their designated voltages ($V_{CC}$, V+, V−, and $V_{GATEOFF}$), the device and the blocks remain off, and capacitor 50' is not charged. However, Logic_In is low, which means that D is low and D/is high. This initiates discharging of capacitor 50' and the gate being pulled down to the negative bias voltage $V_{GATEOFF}$, if present, or the gate being held at ground.

The transition of D going high initiates a rapid transfer of charge from capacitor 50' to the gate. The next transition of D going low initiates a rapid transfer of charge from the gate to capacitor 50'.

Second Embodiment

Determining the Gate Drive Parameters

Once the characteristics of the switched semiconductor device are known, it is relatively straightforward to determine the value for capacitor 50', and the value for V+. The analysis is similar to that for the first embodiment.

Gated devices (FETs and IGBTs) are often described as voltage controlled but are actually charge controlled. The conductance of the device is more a function of the total charge on the gate, which is different from the voltage. As is well known, for linear devices such as capacitors, the capacitance, charge, and voltage are related by the equation V=Q/C (or equivalently, C=Q/V) where V is the voltage in volts, Q is the charge in coulombs, and C is the capacitance in farads. For gated devices, while the gate operates to store charge, it generally cannot be represented as a simple capacitor. Rather, complex impedances cause significant non-linearities in the voltage as a function of charge.

The actual maximum rate of change of charge on the gate of a device is not really known, as the best method of charging a gate to date has been to provide a very low impedance path to a voltage source at the desired final gate voltage. Some device designs have used a negative bias supply to help remove the tails of the turn off current but that still uses a DC voltage applied to the gate. For any given device there is a maximum gate current that the device can tolerate and a maximum voltage between the gate and the source that the device can tolerate without breaking down.

As mentioned above, relevant device characteristics include:
 the full enhancement voltage;
 the full enhancement charge;
 the gate punch-through voltage;
 the maximum current that can be allowed to flow into or out of the gate; and
 the gate impedance.

Of these quantities, the maximum current is not normally specified by the device manufacturer, but can be determined by testing the device The analysis for charging the gate from capacitor 50' will be discussed. As mentioned above, in turning the device on, the gate will be driven to voltage $V_{CC}$, which is slightly (say a volt or two) above the full enhancement voltage but below the punch-through voltage. The desired value of charge on the gate will be referred to as $Q_{GATE}$.

Prior to transferring charge to the gate, the total charge on capacitor 50' is zero. The capacitor will be charged to V+ transferring $C_{CG}*((V+)-V_{CC})$ to the gate. The gate ends up at $V_{CC}$ through the bilateral holding switch defined by transistors Q9 and Q10.

Therefore, a reasonable approximation is as follows:

$$C_{CG}*V+\approx Q_{GATE} \qquad (4)$$

Setting this constraint provides a safety margin and simplifies the calculation. More important to the user is the inductance between capacitor 50' and the actual gate. This inductance will cause an additional amount of charge to be transferred to the gate. However the now lower voltage at the gate node 20 provides negative feedback to quickly quench the current spike in the actual device gate while block 90 transitions to the ON state.

This sets a constraint on $C_{CG}$ and V+, but does not uniquely determine them. However, since it is desired to charge the gate as quickly as possible, V+ is preferably chosen so that the initial current $I_{INITIAL}$ is below the device's maximum tolerable gate current value with appropriate device tolerance margin. If the system level gate impedance is Z, $$V+=I_{INITIAL}*Z \qquad (5)$$

Substituting this into Equation 4 and rearranging leads to:

$$C_{CG}=Q_{GATE}/(I_{INITIAL}*Z) \qquad (6)$$

Consider the following possible example for a given device:

| | |
|---|---|
| $V_{CC}$ | 12 volts |
| $Q_{GATE}$ | 2600 nanocoulombs |
| Z | 1 ohm |
| $I_{INITIAL}$ | 250 amperes |

Note that $V_{CC}$ and $Q_{GATE}$ are not per se specified device characteristics, but rather are values that are based on the full enhancement voltage and the full enhancement charge. For example, the design choice of 12 volts for $V_{CC}$ might be based on a specified full enhancement voltage of 10 volts, i.e., 20% higher. While the gate is not a linear capacitor during the time it is being charged, it is a reasonable to assume a value for $Q_{GATE}$ that is also higher than the full enhancement charge. Similarly, $I_{INITIAL}$ is chosen to be lower than the tested maximum current for the device.

Substituting the "device-dependent" values Of $I_{INITIAL}$ and Z into Equation 5 leads to a value for V+ of (250 amps)*(1 ohm)=250 volts. Substituting this value, along with the "device-dependent" values of $Q_{GATE}$ and $V_{CC}$, into Equation 6 leads to a value for $C_{CG}$ of (2600 nanocoulombs)/(250 volts), or 10.4 nanofarads.

It should be recognized that the above calculations (and the ones for the first embodiment) provide values that may need to be varied for various design constraints. For example, while the computed value of 10.4 nanofarads for capacitors 50 (ChargeGate) and 50 (DischargeGate) in the first embodiment, and capacitor 50' in the second embodiment, components with precisely those values may not be readily available. All values are not available for real components (e.g., small-value high-voltage capacitors may be available only for 10 nanofarads, and with tolerances of ±2% at best). Further, for design efficiency, some users may decide to use voltage supply 45 ($V_{LOAD}$) to define V+ and then specify a capacitor that provides an appropriate safety margin. This may well result in the rapid charging putting the gate at a value that differs slightly from the holding voltage, in which case the holding switch would drain some charge off the gate or supplying the last bit of charge to the gate to move the device well in to the fully enhanced operating region.

CONCLUSION

In conclusion, it can be seen that the present invention provides simple but powerful techniques for improving the speed at which gated devices can be switched.

While the above is a complete description of specific embodiments of the invention, the above description should not be taken as limiting the scope of the invention as defined by the claims.

What is claimed is:

1. A circuit for switching a semiconductor device between first and second device states by controlling the charge on a gate associated with the device, wherein
the first and second device states are characterized by first and second voltages on the gate, with the first voltage being higher than the second voltage, and
the device is characterized by a maximum voltage that the gate can withstand without breaking down,
the circuit comprising:
a first voltage source supplying a third voltage that is higher than the first voltage and is at least as high as the maximum voltage that the gate can withstand without breaking down;
a charge storage device having first and second nodes with said first node connected to a circuit node coupled to the gate;
first switching circuitry for selectively connecting said second node of said charge storage device to said first voltage source;
control circuitry, coupled to said first switching circuitry and responsive to an input signal, wherein when the input signal signifies a transition to the first device state:
said first switching circuitry connects said first voltage source to said second node of said charge storage device, and
said charge storage device transfers an amount of charge characteristic of the charge storage device and said first voltage source to the gate;
wherein:
said charge storage device and said third voltage are chosen so that the voltage on the gate, after said amount of charge is transferred to the gate, is commensurate with the first voltage so as to cause the semiconductor device to enter the first device state,
said charge is supplied to said circuit node coupled to the gate with a time behavior characterized by a sufficiently high initial voltage to overcome a complex impedance that exists between said circuit node and the gate, and
said first voltage source remains disconnected from said circuit node coupled to the gate at all times.

2. The circuit of claim 1 wherein:
the semiconductor device is an n-channel device; and
the first and second device states are ON and OFF states, respectively.

3. The circuit of claim 1 wherein:
the semiconductor device is a p-channel device; and
the first and second device states are OFF and ON states, respectively.

4. The circuit of claim 1, and further comprising:
a second voltage source supplying a voltage generally equal to the first voltage; and
second switching circuitry for selectively connecting said first node of said charge storage device to said second voltage source;
said control circuitry also being coupled to said second switching circuitry, wherein after said amount of charge on the capacitor has been transferred to the gate, said second switching circuitry couples said second voltage source to said first node of said charge storage device to maintain the gate at a voltage generally equal to the first voltage to maintain the device in the first device state.

5. The circuit of claim 1, and further comprising:
a second voltage source supplying a fourth voltage that is lower than the second voltage and has a magnitude that is at least as high as the maximum voltage that the gate can withstand without breaking down;
second switching circuitry for selectively connecting said second node of said charge storage device to said second voltage source;
wherein said control circuitry is also coupled to said second switching circuitry and operates in response to said input signal wherein when the input signal signifies a transition to the second device state:
said first switching circuitry disconnects said first voltage source from said second node of said charge storage device and connects said second voltage source to said second node of said charge storage device, and
said charge storage device transfers an amount of charge characteristic of the charge storage device and said second voltage source from the gate;
wherein:
said charge storage device and said fourth voltage are chosen so that the voltage on the gate, after said amount of charge is transferred from the gate, is commensurate with the second voltage so as to cause the semiconductor device to enter the second device state, and
said voltage source remains disconnected from said circuit node coupled to the gate at all times.

6. A method of switching a semiconductor device between first and second device states by controlling the charge on a gate associated with the device, wherein
the first and second device states are characterized by first and second voltages on the gate, with the first voltage being higher than the second voltage, and
the device is characterized by a maximum voltage that the gate can withstand without breaking down,
the method comprising:
providing a first voltage source supplying a third voltage that is higher than the first voltage and is at least as high as the maximum voltage that the gate can withstand without breaking down;
providing a charge storage device having first and second nodes with said first node connected to a circuit node coupled to the gate;
in response to an input signal specifying a transition from said second device state to said first device state:
connecting said second node of said charge storage device to said first voltage source, and
transferring an amount of charge characteristic of the charge storage device and said voltage source to the gate;
wherein:
said charge storage device and said third voltage are chosen so that the voltage on the gate, after said amount of charge is transferred to the gate, is commensurate with the first voltage so as to cause the semiconductor device to enter the first device state, said charge is supplied to said circuit node coupled to the gate with a time behavior characterized by a sufficiently high initial voltage to overcome a complex impedance that exists between said circuit node and the gate, and said first voltage source remains disconnected from said circuit node coupled to the gate at all times.

7. The method of claim 6 wherein:

the semiconductor device is an n-channel device; and the first and second device states are ON and OFF states, respectively.

8. The method of claim 6 wherein:

the semiconductor device is a p-channel device; and the first and second device states are OFF and ON states, respectively.

9. The method of claim 6, and further comprising:

after the amount of charge on the capacitor has been transferred to the gate, connecting the gate drive point to a voltage source to maintain the gate at a voltage generally equal to the first voltage to maintain the device in the first device state.

10. The method of claim 6, and further comprising:

providing a second voltage source supplying a fourth voltage that is lower than the second voltage and has a magnitude that is at least as high as the maximum voltage that the gate can withstand without breaking down;

in response to an input signal specifying a transition from said first device state to said second device state:

disconnecting said second node of said charge storage device from said first voltage source, and connecting said second node of said charge storage device to said second voltage source, and transferring an amount of charge characteristic of the charge storage device and said second voltage source from the gate;

wherein:

said charge storage device and said fourth voltage are chosen so that the voltage on the gate, after said amount of charge is transferred from the gate, is commensurate with the second voltage so as to cause the semiconductor device to enter the second device state, said second voltage source remains disconnected from said circuit node coupled to the gate at all times.

* * * * *